United States Patent
Feng et al.

(10) Patent No.: US 11,088,223 B2
(45) Date of Patent: Aug. 10, 2021

(54) DISPLAY PANEL AND MANUFACTURING METHOD THEREOF, AND DISPLAY APPARATUS

(71) Applicants: BOE TECHNOLOGY GROUP CO., LTD., Beijing (CN); BEIJING BOE DISPLAY TECHNOLOGY CO., LTD., Beijing (CN)

(72) Inventors: Xiang Feng, Beijing (CN); Sha Liu, Beijing (CN); Qiang Zhang, Beijing (CN); Zhaokun Yang, Beijing (CN); Xiao Sun, Beijing (CN); Ruizhi Yang, Beijing (CN); Yun Qiu, Beijing (CN)

(73) Assignees: BEIJING BOE DISPLAY TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 590 days.

(21) Appl. No.: 15/772,821

(22) PCT Filed: Nov. 15, 2017

(86) PCT No.: PCT/CN2017/111062
§ 371 (c)(1),
(2) Date: May 2, 2018

(87) PCT Pub. No.: WO2018/176852
PCT Pub. Date: Oct. 4, 2018

(65) Prior Publication Data
US 2020/0258956 A1    Aug. 13, 2020

(30) Foreign Application Priority Data
Mar. 31, 2017   (CN) .......................... 201710208630.1

(51) Int. Cl.
*H01L 27/32* (2006.01)
*H01L 27/146* (2006.01)

(52) U.S. Cl.
CPC ...... *H01L 27/3234* (2013.01); *H01L 27/3227* (2013.01); *H01L 27/3244* (2013.01);
(Continued)

(58) Field of Classification Search
CPC ............. H01L 27/3234; H01L 27/3227; H01L 27/3244; H01L 27/14621; H01L 27/14627; H01L 27/14645
See application file for complete search history.

(56) References Cited

U.S. PATENT DOCUMENTS

| 9,153,935 | B2 | 10/2015 | Takayuki et al. |
| 2010/0117991 | A1 | 5/2010 | Koyama et al. |
| 2011/0043735 | A1* | 2/2011 | Kozuma ................. G01J 3/506 349/106 |
| 2014/0022479 | A1 | 1/2014 | Hosaka et al. |

FOREIGN PATENT DOCUMENTS

| CN | 102983154 A | 3/2013 |
| CN | 103364926 A | 10/2013 |

(Continued)

OTHER PUBLICATIONS

International Search Report and Written Opinion dated Jan. 29, 2018 in PCT/CN2017/111062.
(Continued)

*Primary Examiner* — Tucker J Wright
(74) *Attorney, Agent, or Firm* — Syncoda LLC; Feng Ma

(57) ABSTRACT

A display panel includes a substrate, a plurality of pixel units, a first color film, and an optical sensing layer. Each pixel subunit in each pixel unit includes a light-emitting portion. The optical sensing layer is sandwiched between the first color film and the substrate, configured to detect optical signals from an object facing the display panel, and includes a plurality of optical sensing portions, each arranged such
(Continued)

that an orthographic projection thereof on the substrate is substantially covered by an orthographic projection of the first color film on the substrate, yet is not overlapped with an orthographic projection of the light-emitting portion of each pixel subunit on the substrate. A lens layer may be over the optical sensing layer, and an orthographic projection thereof on the substrate substantially covers an orthographic projection of each optical sensing portion on the substrate.

18 Claims, 12 Drawing Sheets

(52) U.S. Cl.
CPC .... *H01L 27/3248* (2013.01); *H01L 27/14621* (2013.01); *H01L 27/14627* (2013.01); *H01L 27/14645* (2013.01)

(56) References Cited

FOREIGN PATENT DOCUMENTS

| | | |
|---|---|---|
| CN | 104300090 A | 1/2015 |
| GN | 104752445 A | 7/2015 |
| JP | 2010153834 A | 7/2010 |

OTHER PUBLICATIONS

1st Office Action dated Mar. 3, 2020 in CN201710208630.1.
Extended European Search Report in Application No. 17870621, dated Oct. 16, 2020.
JP First Office Action in Application No. 2018526803, dated Jun. 28, 2021.

* cited by examiner

Forming a thin-film transistor and an optical sensing portion over a substrate

↓

Forming a planarization layer over a surface of the thin-film transistor and the optical sensing portion opposing to the substrate

↓

Forming a via in the planarization layer at a position corresponding to a signal output terminal of the thin-film transistor

↓

Forming the first electrode layer over a surface of the planarization layer opposing to the substrate, wherein the first electrode layer is electrically coupled to the signal output terminal of the thin-film transistor

↓

Forming a lens layer and an white light-emitting layer over a surface of the first electrode layer opposing to the substrate

↓

Forming a second electrode layer over a surface of the light-emitting layer opposing to the substrate

↓

Forming a third color film over a surface of the second electrode layer opposing to the substrate, wherein an orthographic projection of the third color film on the substrate covers an orthographic projection of the white light-emitting layer and the optical sensing portion on the substrate

FIG. 12

DISPLAY PANEL AND MANUFACTURING METHOD THEREOF, AND DISPLAY APPARATUS

CROSS-REFERENCE TO RELATED APPLICATION

The present application claims priority to Chinese Patent Application No. 201710208630.1 filed on Mar. 31, 2017, the disclosure of which is hereby incorporated by reference in its entirety.

TECHNICAL FIELD

The present disclosure relates generally to the field of display technologies, and specifically to a display panel and a manufacturing method thereof, and a display apparatus.

BACKGROUND

With a rapid development of technologies in electronics, mobile apparatuses having a display panel (i.e. mobile display apparatuses), including smart phones, tablets, and laptops, etc., have been more and more widely applied in daily life. Because of various requirements from customers for high portability, easy usability and aesthetics, there is a current trend for lightness and thinness for these mobile display apparatuses.

SUMMARY

In one aspect, the present disclosure provides a display panel that is capable of displaying images on, and photographing an object facing, a display surface thereof.

The display panel comprises a substrate, a plurality of pixel units, a first color film, and an optical sensing layer. The plurality of pixel units are over the substrate, each comprising at least one pixel subunit. The first color film is over the substrate. The optical sensing layer is sandwiched between the first color film and the substrate, and is configured to detect optical signals from, and based thereon to allow the display panel to photograph the object.

Each of the at least one pixel subunit in each of the plurality of pixel units comprises a light-emitting portion. The optical sensing layer comprises a plurality of optical sensing portions, each arranged such that an orthographic projection thereof on the substrate is substantially covered by an orthographic projection of the first color film on the substrate, yet is not overlapped with an orthographic projection of the light-emitting portion of the each of the at least one pixel subunit on the substrate.

According to some embodiments, the display panel further includes a lens layer over the optical sensing layer, which is configured to allow for effective focusing of the optical signals onto the optical sensing layer. The lens layer is arranged such that an orthographic projection thereof on the substrate substantially covers the orthographic projection of each of the plurality of optical sensing portions on the substrate.

In some embodiments of the display panel, the lens layer is further arranged such that the orthographic projection thereof on the substrate is overlapped with the orthographic projection of the light-emitting portion of the each of the at least one pixel subunit on the substrate.

Herein the lens layer may include a plurality of protrusions, configured such that a surface of each of the plurality of protrusions opposing to the substrate is at least one of a convex shape or a prismatic shape. The lens layer may comprise a resin or a glass.

In the display panel, the light-emitting portion of the each of the at least one pixel subunit in the each of the plurality of pixel units may comprise a first electrode layer over the substrate, a second electrode layer over the first electrode layer, and an organic light-emitting layer between the first electrode layer and the second electrode layer.

In some embodiments of the display panel which includes a lens layer over the optical sensing layer, the lens layer is disposed on a surface of the first electrode layer distal to the substrate.

In the display panel disclosed herein, each of the at least one pixel subunit may comprise a thin-film transistor configured to drive the light-emitting portion to emit a light, wherein the thin-film transistor comprises an electrode electrically coupled to the first electrode layer.

Furthermore, each of the at least one pixel subunit may further comprise an insulating layer between the light-emitting portion and the thin-film transistor, wherein the first electrode layer is electrically coupled to the electrode of the thin-film transistor through a via in the insulating layer.

In the display panel disclosed herein, the first color film may include a plurality of first color filter portions, which are arranged such that an orthographic projection of each of the plurality of first color filter portions on the substrate substantially covers an orthographic projection of one of the plurality of optical sensing portions on the substrate.

According to some embodiments, the plurality of first color filter portions as described above may include a red first color filter portion, a green first color filter portion and a blue first color filter portion.

The display panel disclosed herein may further comprise a pixel defining layer over the substrate, which is configured to define each of the at least one pixel subunit in each of the plurality of pixel units. The pixel defining layer comprises a plurality of pixel defining portions, each arranged such that an orthographic projection thereof on the substrate covers the orthographic projection of each of the plurality of optical sensing portions on the substrate.

According to some embodiments of the display panel, the at least one pixel subunit in each of the plurality of pixel units may include a red pixel subunit, a green pixel subunit, and a blue pixel subunit. In each pixel unit, the red pixel subunit comprises a red light-emitting portion configured to emit a red light; the green pixel subunit comprises a green light-emitting portion configured to emit a green light; and the blue pixel subunit comprises a blue light-emitting portion configured to emit a blue light.

According to some other embodiments of the display panel, each of the at least one pixel subunit in each of the plurality of pixel units comprises a white light-emitting portion configured to emit a white light. The display panel further includes a second color film over the white light-emitting portion in the each of the at least one pixel subunit in each of the plurality of pixel units. The second color film comprises a plurality of second color filter portions, arranged such that an orthographic projection of each of the plurality of second color filter portions on the substrate substantially covers an orthographic projection of the white light-emitting portion in each of the at least one pixel subunit in each of the plurality of pixel units.

Herein, in some embodiments, it is further arranged such that the orthographic projection of each of the plurality of second color filter portions on the substrate further substantially covers an orthographic projection of one of the plurality of optical sensing portions of the optical sensing layer on the substrate.

Herein, the plurality of second color filter portions may comprise a red second color filter portion, a green second color filter portion, and a blue second color filter portion.

In any of the embodiments of the display panel, each of the plurality of optical sensing portions may include an optoelectronic diode, which is configured to convert at least one of the optical signals into an electric signal.

According to some embodiments of the display panel disclosed herein, each of the plurality of optical sensing portions and each pixel subunit correspond to one another in a one-to-one relationship. An orthographic projection of the each of the plurality of optical sensing portions on the substrate is adjacent to an orthographic projection of a corresponding pixel subunit on the substrate.

Herein, the plurality of pixel units may be arranged in a matrix having rows and columns, wherein each pixel unit in each row comprises at least three pixel subunits. The at least three pixel subunits are configured to each provide a light of a different primary color, and to together provide a white light. A corresponding optical sensing portion of each of the at least three pixel subunits is configured to detect a light of a different primary color to thereby allow a mixing of lights to form a white light by the optical sensing portions corresponding to the at least three pixel subunits.

According to some other embodiments of the display panel, the plurality of optical sensing portions correspond to some, but not all, of the pixel subunits. An orthographic projection of the each of the plurality of optical sensing portions on the substrate is adjacent to an orthographic projection of a corresponding pixel subunit on the substrate.

Herein, the plurality of pixel units may be arranged in a matrix having rows and columns, wherein each pixel unit in each row comprises at least three pixel subunits. The at least three pixel subunits are configured to each provide a light of a different primary color, and to together provide a white light. Every n adjacent pixel units along a column direction are configured such that only one of the at least three pixel subunits in each of the every n adjacent pixel units is provided with a corresponding optical sensing portion, configured to detect a light of a different primary color to thereby allow a mixing of lights to form a white light by the optical sensing portions corresponding to the every n adjacent pixel units. Here n is an integer no less than three.

In another aspect, the present disclosure further provides a display apparatus. The display apparatus comprises a display panel according to any one of the embodiments as described above.

BRIEF DESCRIPTION OF THE DRAWINGS

To more clearly illustrate some of the embodiments disclosed herein, the following is a brief description of the drawings. The drawings in the following descriptions are only illustrative of some embodiments. For those of ordinary skill in the art, other drawings of other embodiments can become apparent based on these drawings.

FIG. 12 is a flow chart of a method for manufacturing a display panel according to a fourth embodiment of the disclosure.

DETAILED DESCRIPTION

Figure 1:
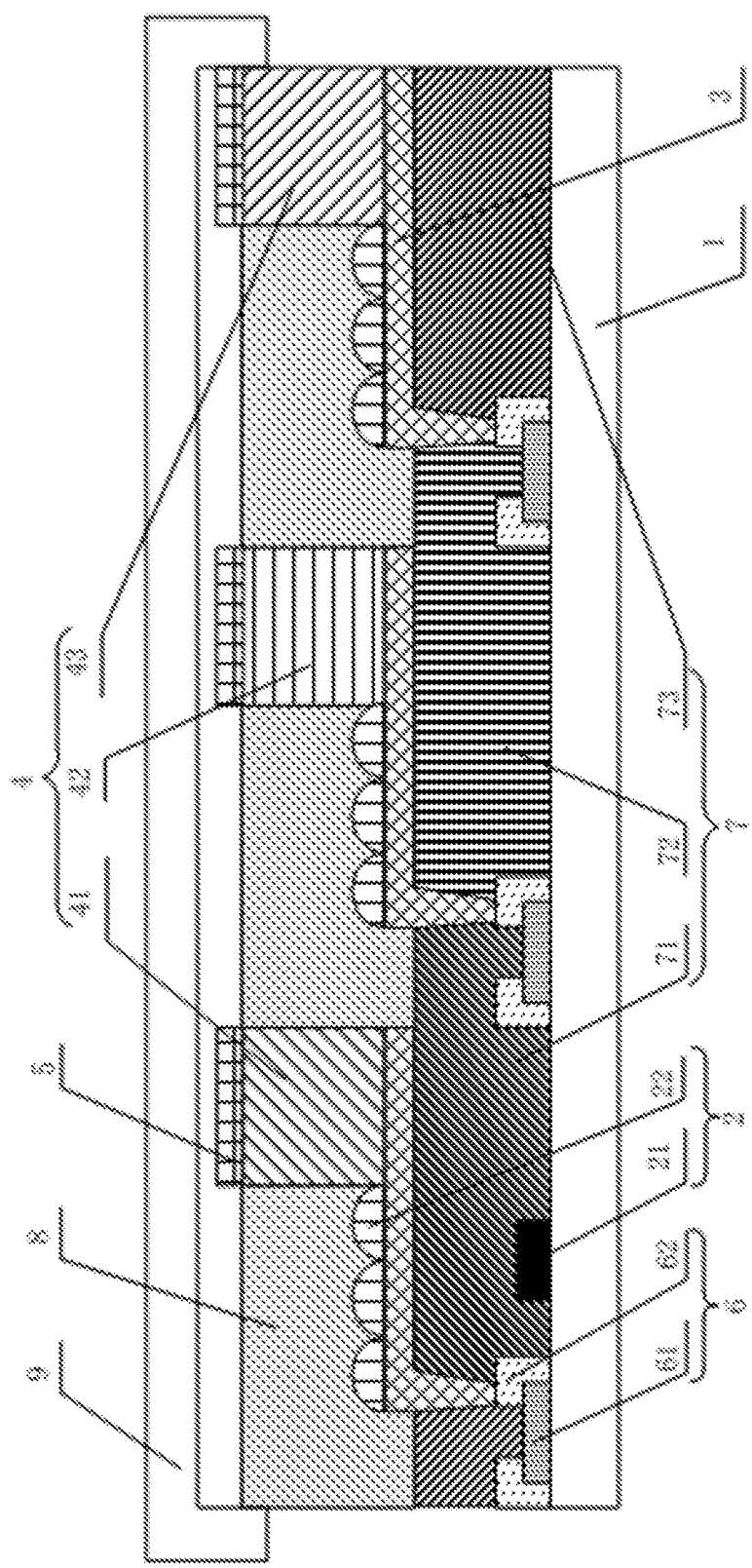
FIG. 1 is a schematic diagram of a display panel according to a first embodiment of the disclosure.

Currently a lot of mobile display apparatus, such as cellular phones, tablets, laptop computers, are provided with a front-facing camera. The front-facing camera typically includes an optical sensing unit and a driving circuit for driving the optical sensing unit. The optical sensing unit usually contains a lens and optoelectronic diodes.

According to a conventional technology, in order to realize an effective photographing (i.e. image-capturing) functionality for the front-facing camera in a mobile display apparatus, the front-facing camera generally needs to have a sufficient area for effective optical sensing in the mobile display apparatus (i. e. the lens and the optoelectronic diodes are required to have a sufficient area in the front-facing camera in the mobile display apparatus).

Consequently, the front-facing camera in a conventional technology in the field typically serves as an independent component in a mobile display apparatus, which commonly takes some area and space in the mobile display apparatus, thus substantially imposing a limitation to the thinness of the whole mobile display apparatus. As such, the current mobile display apparatuses as described above fail to meet the trend for minimal lightness and thinness, which in turn fails to meet customers' needs in the market.

The present disclosure provides a display panel and a manufacturing method thereof, and a display apparatus containing the display panel. The display panel disclosed herein substantially comprises pixel subunits that are provided with a camera functionality, which thus addresses the disadvantages associated with current mobile display apparatuses having a front-facing camera, such as limited lightness and thinness.

With reference to the various embodiments of the invention as illustrated in the figures that forego, the following is a detailed description of the invention. It is obvious that the described embodiments are merely a circuit but not all the embodiments of the disclosure. Based on the described embodiments of the disclosure, those ordinarily skilled in the art can obtain other embodiment(s), which come(s) within the scope sought for protection by the disclosure.

In a first aspect, the present disclosure provides a display panel capable of displaying images on and photographing an object facing a display surface thereof. The display panel comprises a substrate, a plurality of pixel units, a first color film, and an optical sensing layer. The plurality of pixel units are over the substrate, each comprising at least one pixel subunit. The first color film is over the substrate. The optical sensing layer is sandwiched between the first color film and the substrate, and is configured to detect optical signals from, and based thereon to allow the display panel to photograph the object.

Each of the at least one pixel subunit in each of the plurality of pixel units comprises a light-emitting portion. The optical sensing layer comprises a plurality of optical sensing portions, each arranged such that an orthographic projection thereof on the substrate is substantially covered by an orthographic projection of the first color film on the substrate, yet is not overlapped with an orthographic projection of the light-emitting portion of the each of the at least one pixel subunit on the substrate.

According to some embodiments, the display panel further includes a lens layer over the optical sensing layer, which is configured to allow for effective focusing of the optical signals onto the optical sensing layer. The lens layer is arranged such that an orthographic projection thereof on the substrate substantially covers the orthographic projection of each of the plurality of optical sensing portions on the substrate.

FIGS. 1-5 illustrate a display panel according to several different embodiments of the disclosure. As shown in the figures, the display panel includes a substrate 1 and a plurality of pixel subunits that are disposed over the substrate 1, and each pixel subunit includes a light-emitting portion. Herein the light-emitting portion can be an OLED light-emitting portion.

The display panel further includes an optical sensing layer, comprising a plurality of optical sensing portions 21. Each optical sensing portion 21 can include at least one optoelectronic diode, which is disposed over the substrate 1 and is configured to detect an optical signal from an object facing the light-emitting surface of the display panel, and to convert the optical signals into an electric signal.

The display panel further includes a lens layer over the optical sensing layer 22. The lens layer is disposed over a first electrode layer in the light-emitting portion, and includes a plurality of lens portions 22 corresponding to the plurality of optical sensing portions 21. Herein, the plurality of lens portions 22 in the lens layer corresponding to the plurality of optical sensing portions 21 in the optical sensing layer is defined such that an orthographic projection of each lens portion 22 on the substrate substantially covers the orthographic projection of each optical sensing portion 21 on the substrate. Each optical sensing portion 21 and its corresponding lens portion 22 substantially form an optical sensing assembly 2.

Herein in each pixel subunit, the light-emitting portion typically includes a first electrode layer 3, a second electrode layer 5, and a light-emitting layer that is disposed between the first electrode layer 3 and the second electrode layer 5. The light-emitting layer can be an OLED light-emitting layer. The first electrode layer 3 is arranged to be relatively closer to the substrate 1, whereas the second electrode layer 5 is arranged to be relatively farther from the substrate 1.

Specifically, the light-emitting layer in the light-emitting portion can comprise a single layer, and can, for example, include one single light-emitting layer that is disposed between the first electrode layer 3 and the second electrode layer 5.

Alternatively, the light-emitting layer in the light-emitting portion can comprise more than one layer, and can, for example, include a hole transmission layer, a light-emitting layer, and an electron transmission layer.

Further specifically, the first electrode layer 3 can be configured to be an anode layer or can be a cathode layer. If the first electrode layer 3 is an anode layer, the second electrode layer 5 is correspondingly a cathode layer; whereas if the first electrode layer 3 is a cathode layer, the second electrode layer 5 is correspondingly an anode layer.

It should be noted that in the five embodiments of the display panel as shown in FIGS. 1-5, the first electrode layer 3 is an anode layer, and that the second electrode layer 5 is a cathode layer. These five embodiments essentially serve only as illustrating examples, and thus do not impose a limitation to the scope of the disclosure.

Herein the first electrode layer 3 can have a composition of an indium tin oxide (ITO), which substantially constitutes a transparent conductive glass. Yet the first electrode layer 3 can also have a composition other than an ITO. There are no limitations herein.

The light-emitting layer in the light-emitting portion can be configured to emit lights to a top of the display panel (i.e. thus configured as a top-emitting display panel) or to a bottom of the display panel (i.e. thus configured as a bottom-emitting display panel). In the embodiments as provided in the disclosure, it is illustratively configured such that the display panel is a top-emitting type of display panel (i.e. the light-emitting layer in the light-emitting portion is configured to emit lights to a top of the display panel).

The display panel disclosed herein can be configured to realize the light emission to the top of the display panel through a microcavity optical structure or a non-microcavity optical structure.

As shown in FIGS. 1-5, each optical sensing portion 21 is disposed over the substrate 1, and is specifically arranged on a top surface of the substrate 1 (i.e. a surface of the substrate 1 that is facing the light-emitting portion). Each lens portion 22 is disposed on the first electrode layer 3 of the light-emitting portion, and is specifically arranged on a top surface of the first electrode layer 3 (i.e. a surface of the first electrode layer 3 that is facing the light-emitting layer).

In order to ensure that there is sufficient illumination for the display panel, there is no limitation to the total number of optoelectronic diodes in each optical sensing portion 21. Specifically, one or more optoelectronic diodes can be arranged in each optical sensing portion 21, and the total number of the optoelectronic diodes 21 arranged therein can be determined based on practical needs by people of ordinary skills in the field.

Specifically, each optical sensing portion 21 and the lens portion 22 corresponding thereto can be configured such that an orthographic projection of the one or more optoelectronic diodes in each optical sensing portion 21 on the substrate 1 is substantially contained within an orthographic projection of the corresponding lens portion 22 on the substrate 1. Such a configuration ensures that a maximal amount of lights that emit out from each lens portion 22 can reach each corresponding optical sensing portion 21.

It is noted that there is no limitation to the relative positional arrangement of each optical sensing portion 21 and its corresponding lens portion 22, as long as the optical signal can shed onto the each optical sensing portion 21 after transmitting through the corresponding lens portion 22, and as an accurate transmission of the optical signal is not substantially affected during the transmission.

In the display panel disclosed herein, when the display panel is on a camera mode (i.e. on a photographing mode) to capture images, the light-emitting portion does not emit light, and the optical signals from an object facing the display panel, which are substantially diffuse reflection optical signal from the object, can sequentially transmit through an encasing substrate 9, a pixel defining portion 8 in a pixel defining layer, a lens portion 22, and a first electrode layer 3, and can then shed onto a corresponding optical sensing portion 21 after being focused by the lens portion 22.

If the optical sensing portion 21 includes one or more optoelectronic diodes, the optical sensing portion 21 can in turn convert the optical signal into an electric signal, which is then output to the display panel to thereby complete the collection of the optical signals from the object to ultimately capture the images of the object.

Furthermore, when the display panel is on a display mode, the optical sensing portions 21 are all on a non-operating status, and the light-emitting portion in each of the plurality of pixel subunit emits lights.

Because the lens portion 22 is arranged on a top surface of the first electrode layer 3, the lights emitted from the light-emitting portion can thus be refracted or diffracted under the action of the lens portion 22, which in turn can cause an increase of the light extraction rate of the light-emitting portion, allowing the display panel to display relatively normally.

In the display panel as described above, an optical sensing portion 21 and its corresponding lens portion 22 can be substantially integrated into one pixel subunit.

The above-mentioned configuration not only can improve a utilization rate of the inner space of the display panel, but also can further avoid the issue that a front-facing camera, typically as an independent component according to conventional technologies, needs to be separately installed in the display device, thereby occupying some space therein.

Specifically, the display panel as described above can cause a reduced thickness of the whole display apparatus compared with a display apparatus having a front-facing camera, thus benefiting the development of thinner and lighter display apparatuses.

Furthermore, in addition to the display functionality, the above-mentioned display panel can also be used as a camera to realize an image capturing functionality (i.e. a photographing functionality), thereby increasing a value of the display panel.

In addition, because the lens portion 22 is arranged on a top surface of the first electrode layer 3, the lights emitted from the light-emitting portion can thus be refracted or diffracted under the action of the lens portion 22, which in turn can reduce the loss of the lights emitted from the light-emitting portion, causing an increased light extraction rate of the light-emitting portion and an optimized display functionality of the display panel.

There can be a variety of choices (or different embodiments) regarding the composition of the lens portion 22. For examples, the lens portion 22 can have a composition of, but is not limited to, a resin or a glass.

In addition, regardless of the composition of the lens portion 22, there can also be a variety of choices (or different embodiments) regarding the structure (e.g. shape, number, and distribution) of the lens portion 22. Because it is preferable that the optical sensing portion 21 has a high light extraction rate, and the light extraction rate is related with an outer surface area of the lens portion 22, the lens portion 22 is configured to have a high outer surface area.

Figure 2:
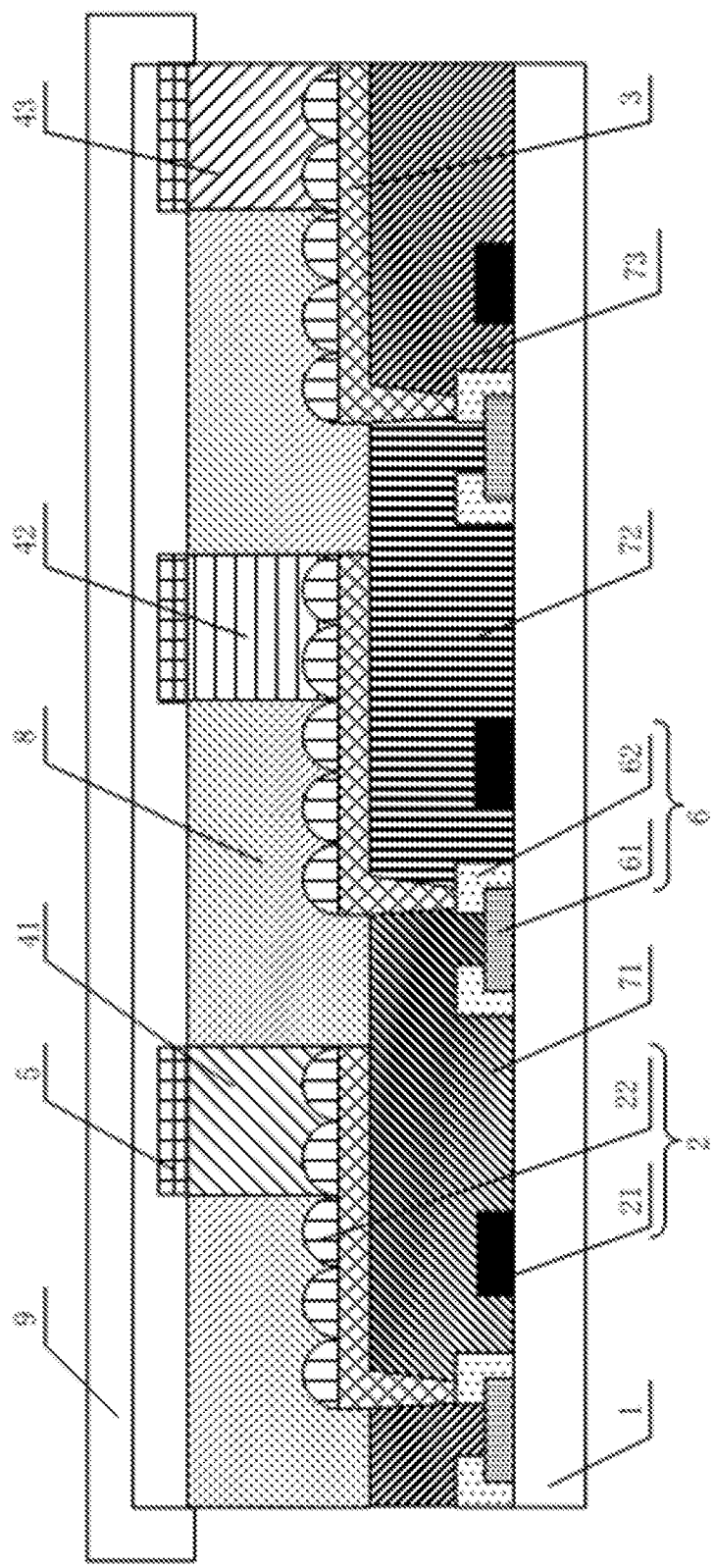
FIG. 2 is a schematic diagram of a display panel according to a second embodiment of the disclosure.
Figure 3:
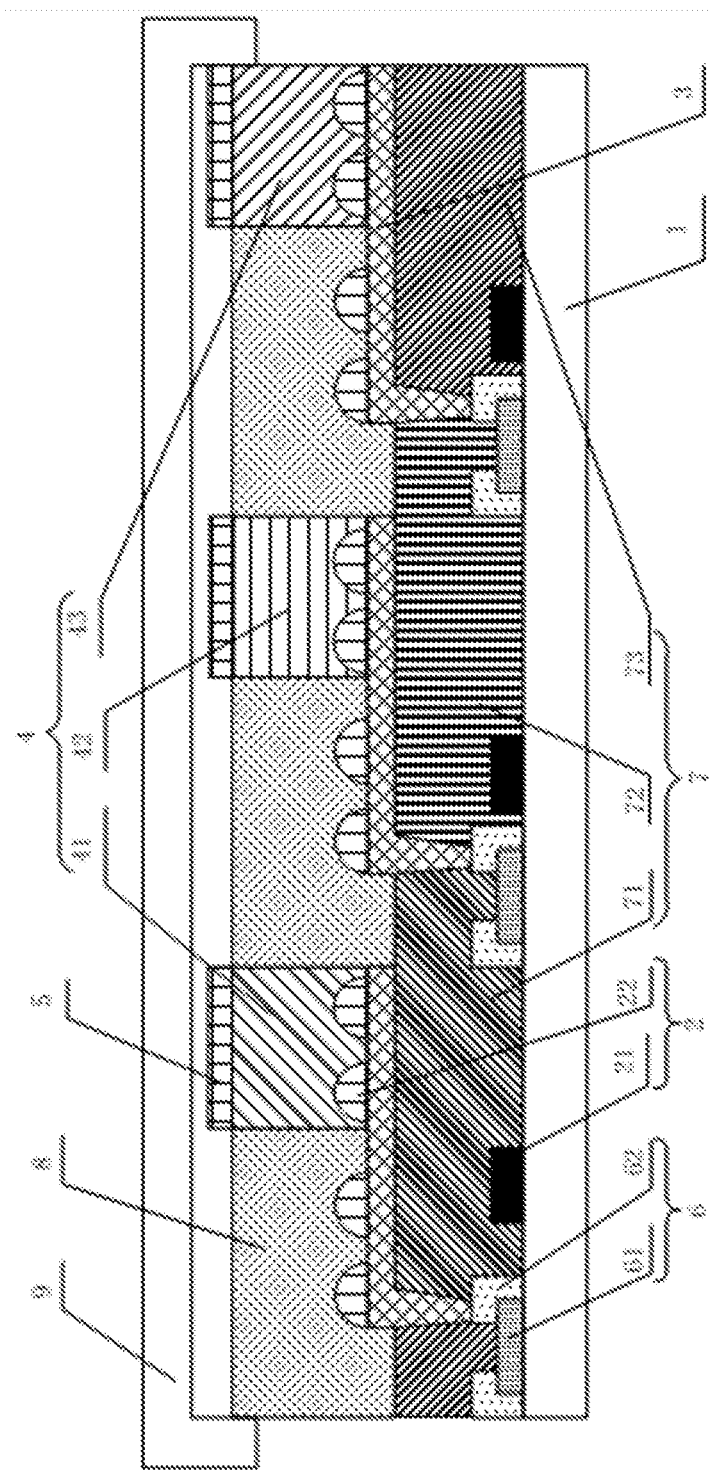
FIG. 3 is a schematic diagram of a display panel according to a third embodiment of the disclosure.

FIG. 2 and FIG. 3 illustrate two embodiments of the display panel. As shown in each of the two figures, the lens portion 22 includes a plurality of protrusions, clustered together (as shown in FIG. 2) or separated to one another (as shown in FIG. 3). Furthermore, each of the plurality of protrusions of the lens portion 22 is disposed on a surface of the first electrode layer 3 that is relatively farther away from the substrate 1 (i.e. the top surface of the first electrode layer 1, compared with the bottom surface thereof which is relatively closer to the substrate 1).

In the display panel as illustrated in either FIG. 2 or FIG. 3, on the top surface of the first electrode layer 1 in the light-emitting portion, the plurality of protrusions together substantially form the lens portion 22, which can increase the effective optical sensing area for the lens portion 22, in turn allowing the display panel to be able to better capture images.

It is noted that parameters for the lens portion 22, such as shape, size, and refractive index thereof, can be adjusted by people of ordinary skills in the field based on practical needs, so as to allow the optical sensing portion 21 to obtain good quality of the optical signal.

Specifically, a surface of each of the plurality of protrusions in the lens portion 22 that is opposing to the substrate 1 can take a shape of a convex, a prismatic, or take other common lens shapes. Depending on the shape of the plurality of protrusions, one or more parameters for each of the plurality of protrusions in the lens portion 22 can be adjusted to ensure a maximal focusing effect for the lens portion 22, which can increase a luminous flux of the optical signals that enter into a corresponding optical sensing portion 21 in the light-emitting portion, in turn resulting in an increased light extraction rate of the light-emitting portion.

For example, if one protrusion takes a convex surface, a convex radius of the convex outer surface can be adjusted to thereby ensure a maximal focusing effect for the one protrusion, whereas if one protrusion takes a prismatic outer surface, a vertex angle of the prismatic outer surface can be adjusted to thereby ensure a maximal focusing effect for the one protrusion.

FIG. 1 illustrates one embodiment of the display panel, and as shown in the figure, the display panel includes a plurality of pixel defining portions 8 in a pixel defining layer that is disposed between the first electrode layer 3 and the second electrode layer 5. The plurality of pixel defining portions 8 are configured to define each individual pixel subunit.

Each pixel subunit includes a display region and a non-display region. One pixel defining portion 8 that is adjacent to any pixel subunit is in the non-display region, whereas the light-emitting portion between two adjacent pixel defining portions 8 is in the display region, as illustrated in FIG. 1. Each of the plurality of pixel defining portions 8 can have a composition of a transparent resin, and the light-emitting layer can have a composition of an ultra-thin layer of an organic electroluminescent material.

In each pixel subunit, the first electrode layer 3 can include a first portion and a second portion. The first portion of the first electrode layer 3 is in the display region of the each pixel subunit, and the second portion of the first electrode layer 3 is in the non-display region of the each pixel subunit.

As illustrated in FIG. 1, each optical sensing portion 21 is disposed over a top surface of the substrate 1, specifically at a position corresponding to the second portion of the first electrode layer 3, i.e., each optical sensing portion 21 is at a position of the top surface of the substrate 1 such that an orthographic projection of the each optical sensing portion 21 on the substrate 1 is contained within an orthographic projection of the second portion of the first electrode layer 3 on the substrate 1.

The lens portion 22 can be disposed on the top surface of the second portion of the first electrode layer 3, as illustrated in FIG. 1, or can be disposed on the whole top surface of the first electrode layer 3 (i.e. on a top surface of both the first portion and the second portion of the first electrode layer 3), as illustrated in any of FIGS. 2-6.

It is noted that by arranging the lens portion 22 on the top surface of the second portion of the first electrode layer 3 (i.e. by arranging the lens portion 22 in the non-display region of each pixel subunit), the lens portion 22 and the corresponding optical sensing portion 21 together can form an optical sensing assembly 2 to thus allow an effective capture of the optical signals from the object to be photographed.

Further by arranging the lens portion 22 on the top surface of the first portion of the first electrode layer 3 (i.e. by arranging the lens portion 22 in the display region of each pixel subunit), when the display panel is on the display mode, lights from the light-emitting layer can emit out through the lens portion 22, which can reduce the loss of lights from the light-emitting layer, in turn resulting in an increased light extraction rate for the light-emitting portion.

In order for the display panel as described above to capture colored images and to improve the photographing effect thereof, a first color film 7 is arranged between the optical sensing portion 21 and the first electrode layer 3, as illustrated in FIG. 1. Herein the first color film 7 can comprise a colored transparent insulating layer.

Specifically, the first color film can comprise a plurality of first color filter portions, arranged such that an orthographic projection of each first color filter portion on the substrate substantially covers an orthographic projection of one optical sensing portion on the substrate. The plurality of first color filter portions comprises a red first color filter portion, a green first color filter portion and a blue first color filter portion.

In order to employ a RGB (red, green and blue) working mechanism for the display panel to thereby realize the color presentation, specifically, the three first color films 7 in one pixel unit can include a red first color filter portion 71, a green first color filter portion 72, or a blue first color filter portion 73, which respectively correspond to a red pixel subunit (i.e. R pixel subunit), a green pixel subunit (i.e. G pixel subunit) and a blue pixel subunit (i.e. B pixel subunit) of the one pixel unit.

Each of the red first color filter portion 71, the green first color filter portion 72, and the blue first color filter portion 73 is disposed to cover the optical sensing portion 21 in each pixel subunit. As such, when the optical signals respectively transmit through the red first color filter portion 71, the green first color filter portion 72, and the blue first color filter portion 73 to thereby shed onto the optical sensing portion 21 corresponding respectively thereto, the optical sensing portion 21 can detect an optical signal for each of the three primary colors, which can be mixed subsequently to thereby re-establish a colored image of the object to be photographed, realizing the camera functionality (or photographing functionality) for the display panel.

In the display panel as described above, each pixel subunit includes an light-emitting portion, which is configured to emit a light to thereby realize a display functionality for the display panel. Two approaches (i.e. two embodiments) can be taken to realize the emission of colored lights for the display panel.

In a first approach as illustrated in FIG. 1, each light-emitting portion in each pixel subunit can comprise a colored OLED light-emitting layer 4. In each of the R pixel subunit, the G pixel subunit and the B pixel subunit in each pixel unit, the colored OLED light-emitting layer 4 can correspondingly be a red OLED light-emitting layer 41, a green OLED light-emitting layer 42, and a blue OLED light-emitting layer 43, which together can ensure that the red light, the green light, and the blue light emitted therefrom can be mixed to thereby realize the display of a colored image for the display panel.

Figure 4:
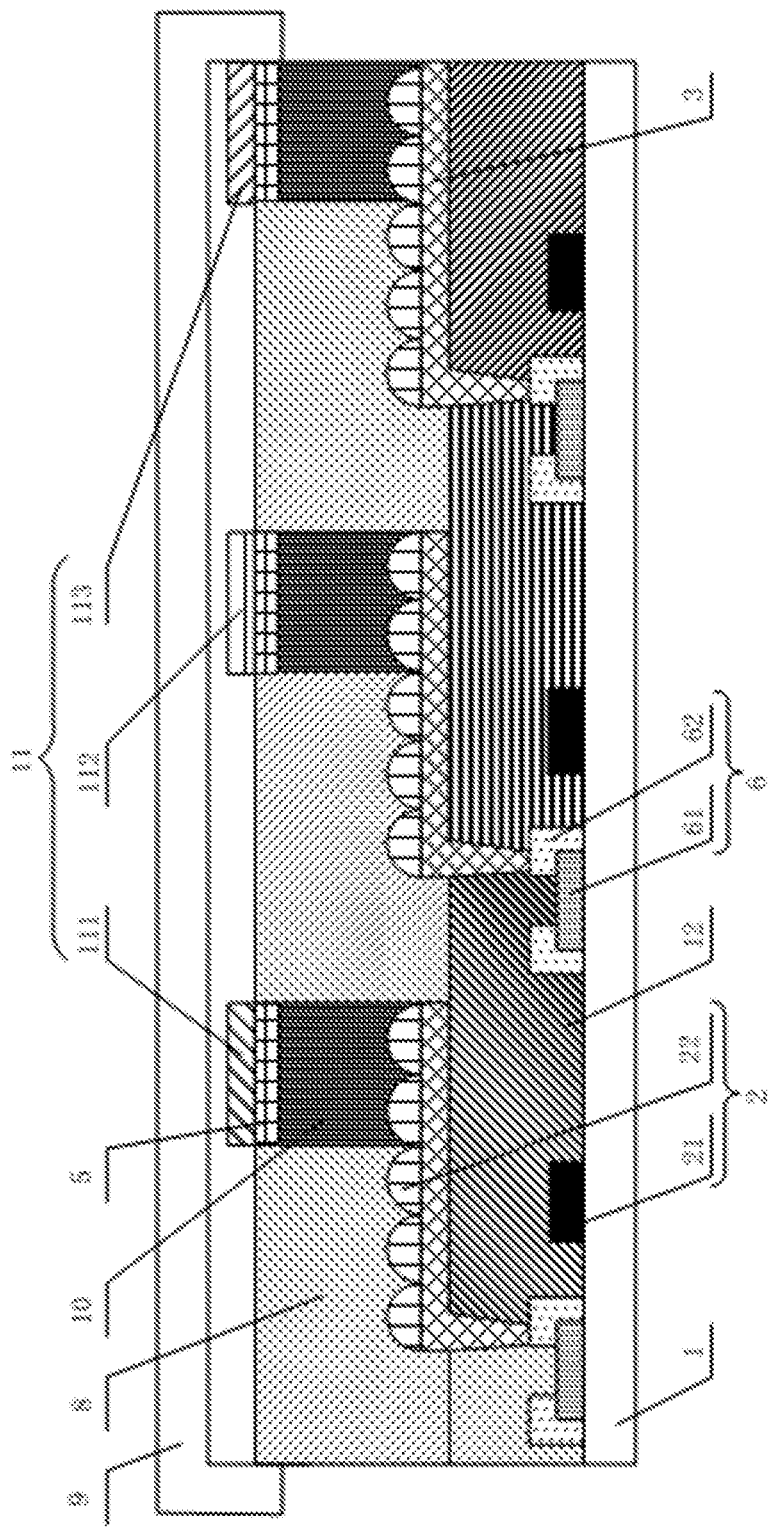
FIG. 4 is a schematic diagram of a display panel according to a fourth embodiment of the disclosure.

In a second approach as illustrated in FIG. 4, each light-emitting portion in each pixel subunit can comprise a white light-emitting layer 10, and a second color film 11 is further disposed on a top surface of the second electrode layer 5 (i.e. the surface relatively farther away from the OLED light-emitting layer 10) in the display region of each pixel subunit.

The second color film 11 can comprise a plurality of second color filter portions. The plurality of second color filter portions can include a red second color filter portion 111, a green second color filter portion 112, and a blue second color filter portion 113, which correspond respectively to a R pixel subunit, a G pixel subunit and a B pixel subunit in each pixel unit.

By such a configuration, white lights from the white light-emitting layer 10 can be filtered by each of the red second color filter portion 111, the green second color filter portion 112, and the blue second color filter portion 113 to thereby obtain a red light, a green light, and a blue light, which can then be mixed to thereby realize the display of a colored image for the display panel.

Figure 5:
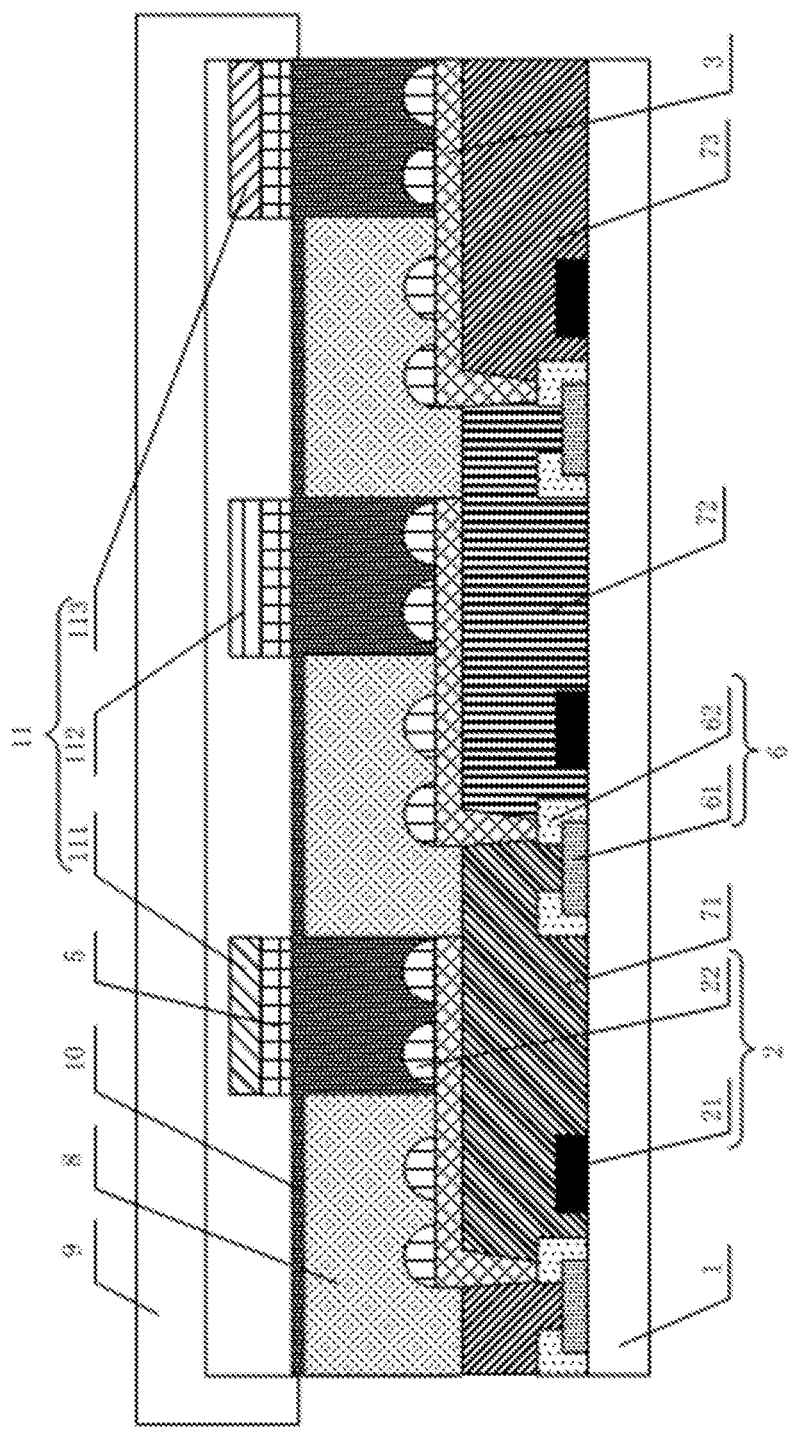
FIG. 5 is a schematic diagram of a display panel according to a fifth embodiment of the disclosure.

If each light-emitting portion in each pixel subunit comprises a white light-emitting layer 10, the white light-emitting layer 10 in each pixel subunit can be manufactured as an integrated white light-emitting layer 10, as illustrated in FIG. 5. Each second electrode layer 5 and each second color film 11 can be further manufactured in the display region of each pixel subunit over the white light-emitting layer 10.

It is noted that in addition to the above two approaches, there are other approaches that can realize the display of a colored image for the display panel, and these two aforementioned approaches do no impose limitations to the scope of the present disclosure herein.

Figure 6:
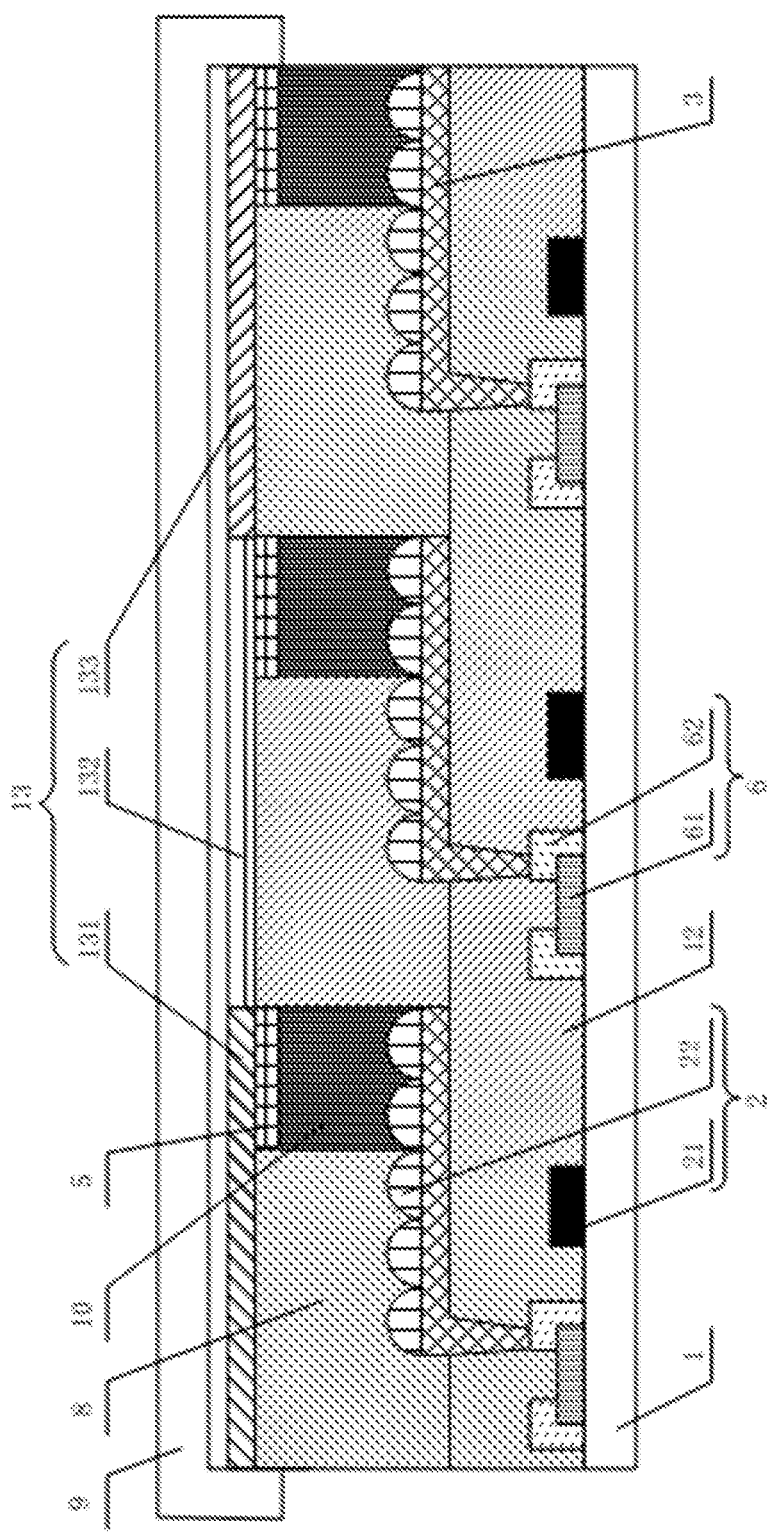
FIG. 6 is a schematic diagram of a display panel according to a sixth embodiment of the disclosure.

With reference to FIG. 6, which illustrates yet another embodiment of the display panel. As shown in the figure, each light-emitting portion in each pixel subunit comprises a white light-emitting layer 10, and unlike the embodiments as shown in any of FIGS. 1-5, there is no first color film 7 between the optical sensing portion 21 and the first electrode layer 3, and a planarization layer 12 is disposed between the optical sensing portion 21 and the first electrode layer 3 to cover the optical sensing portion 21.

In order to both realize the capture of color images of an object to be photographed and realize the display of colored images for the display panel, a third color film 13 can be disposed on a top surface of the second electrode layer 5 (i.e. the surface relatively farther away from the white light-emitting layer 10) in each pixel subunit.

The third color film 13 can comprise a plurality of third color filter portions. The plurality of third color filter portions can include a red third color filter portion 131, a green third color filter portion 132, and a blue third color filter portion 133, corresponding to a red pixel subunit, a green pixel subunit, and a blue pixel subunit of each pixel unit in the display panel.

It is further configured such that in each pixel unit, an orthographic projection of each third color filter portion on the substrate 1 covers an orthographic projection of a corresponding white light-emitting layer 10 and a corresponding optical sensing portion 21.

On the one hand, such a configuration ensures that white lights from the white light-emitting layer 10 can be filtered by each of the red third color filter portion 131, the green third color filter portion 132, and the blue third color filter portion 133 to thereby obtain a red light, a green light, and a blue light, which can be mixed to thereby realize the display of a colored image for the display panel.

On the other hand, such a configuration ensures that when optical signal respectively transmit through the red third color filter portion 131, the green third color filter portion 132, and the blue third color filter portion 133 to thereby shed onto the optical sensing portion 21 corresponding respectively thereto, the optical sensing portion 21 can detect an optical signal for each of the three primary colors, which can subsequently be mixed to thereby re-establish a colored image of the object to be photographed, realizing the camera functionality (or photographing functionality) for the display panel.

It is noted that in addition to the embodiment where the third color film 13 is disposed on the top surface of the second electrode layer 5 as illustrated in FIG. 6, the third color film 13 can also be disposed on a surface of the encasing substrate 9, such as on the surface thereof opposing to the substrate 1.

In the display panel, each pixel subunit can further include a thin-film transistor (TFT) 6, disposed between the substrate 1 and the first color film 7, as illustrated in FIG. 1.

The first color film 7 is provided with a via, and the first electrode layer 3 is configured to electrically couple, or connect, a signal output terminal 62 of the thin-film transistor 6 through the via, such that the thin-film transistor 6 can, upon receiving a control signal, control whether the light-emitting portion in the each pixel subunit to emit lights, so as to realize a display control for the display panel.

Further as shown in FIG. 1, the signal output terminal 62 of the thin-film transistor 6 can be a TFT source electrode or a TFT drain electrode of the thin-film transistor 6, and an active layer 61 of the thin-film transistor 6 is disposed on a top surface of the substrate 1 (i.e. the surface of the substrate 1 facing the first electrode layer 3).

It is noted that in the embodiment of the display panel as described above, the first color film 7 is disposed between the optical sensing portion 21 and the first electrode layer 3, and the first color film 7 is also configured to cover the thin-film transistor 6.

In order to increase the reliability of the display panel, the first color film 7 can be a colored transparent insulating layer, and thus can have a composition that is colored, transparent, and insulting. As such, the optical sensing portion 21, the thin-film transistor 6, and the first electrode layer 3 can be ensured to be insulated from one another, which can effectively avoid the issue that an electrical leakage or interference among the optical sensing portion 21, the thin-film transistor 6, and the first electrode layer 3 may negatively influence the reliability of the display panel.

It is further noted that in the embodiment of the display panel as illustrated in FIG. 6 where the third color film 13 is included, a planarization layer 12 is disposed between the optical sensing portion 21 and the first electrode layer 3, the planarization layer 12 is further configured to cover each of the optical sensing portion 21, and a thin-film transistor (TFT) 6 can be disposed between the substrate 1 and the planarization layer 12, as illustrated in FIG. 6.

The planarization layer 12 is provided with a via, and the first electrode layer 3 is configured to electrically couple, or connect, a signal output terminal 62 of the thin-film transistor 6 through the via, such that the thin-film transistor 6 can, upon receiving a control signal, control whether the light-emitting portion in the each pixel subunit to emit lights, so as to realize a display control for the display panel.

In the embodiment of the display panel as described above, the signal output terminal 62 of the thin-film transistor 6 can be a TFT source electrode or a TFT drain electrode of the thin-film transistor 6, and an active layer 61 of the thin-film transistor 6 is disposed on a top surface of the substrate 1 (i.e. the surface of the substrate 1 facing the first electrode layer 3).

The planarization layer 12 is further configured to be insulating to thus ensure that the optical sensing portion 21, the thin-film transistor 6, and the first electrode layer 3 are insulated from one another.

To reduce the amount of signal lines in, and to simplify the structure of, the display panel, the optical sensing portion 21 and the thin-film transistor 6 in a same pixel subunit can be configured to share a common signal line (i.e. be electrically coupled to a same signal line) according to some embodiments of the disclosure.

Accordingly, the shared common signal line can be utilized to transmit a different signal at a different time interval by means of a timing control unit in the display panel, thereby realizing respective transmission of signals to the optical sensing portion 21 and the thin-film transistor 6 for the shared common signal line.

In any of the above-mentioned embodiments of the display panel, the optical sensing portion 21 can be arranged in each pixel subunit, or can be arranged in some, but not all of the pixel subunits.

Figure 7:
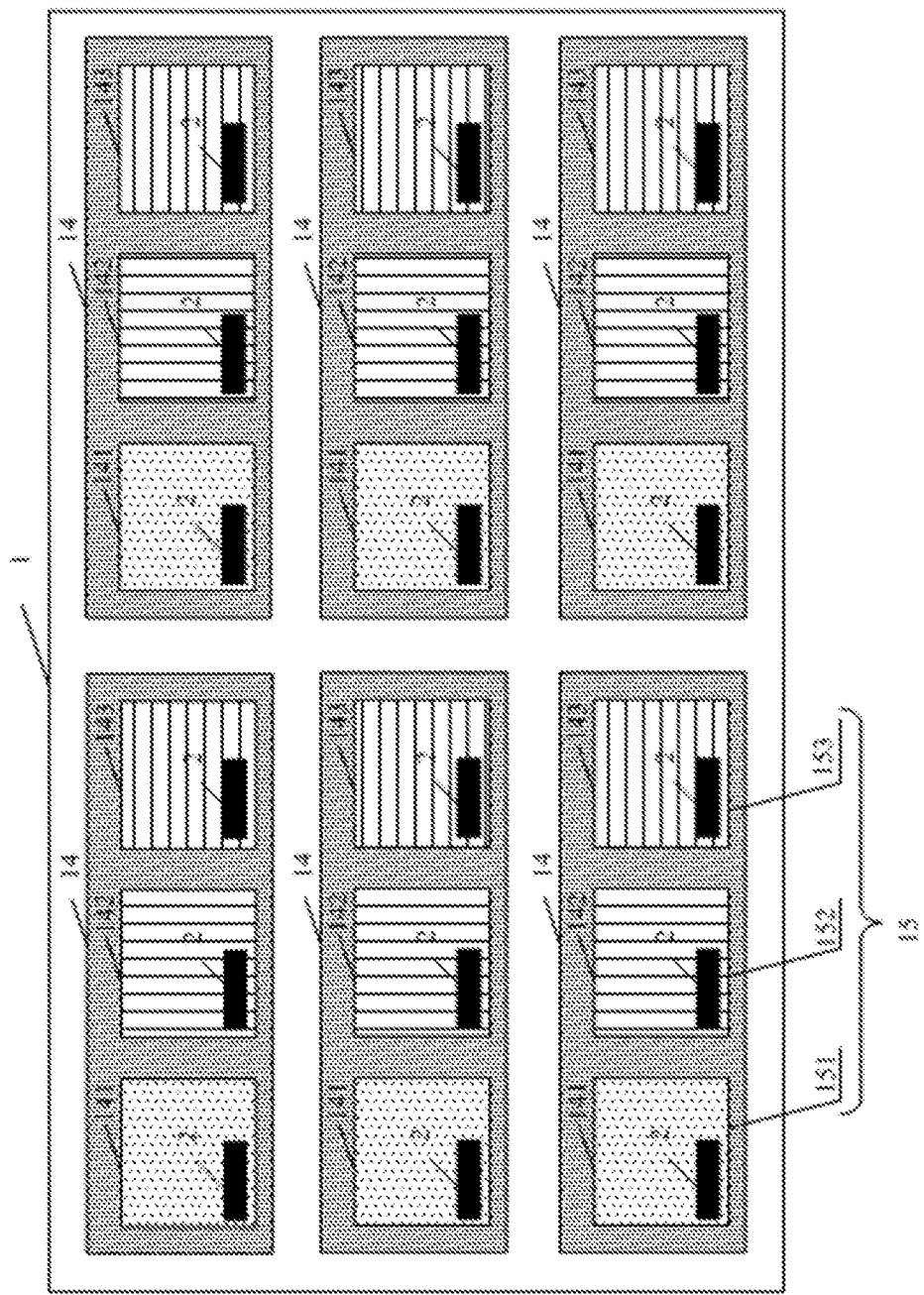
FIG. 7 illustrates a distribution of the photographing pixel unit in the display panel according to a first embodiment of the disclosure.
Figure 8:
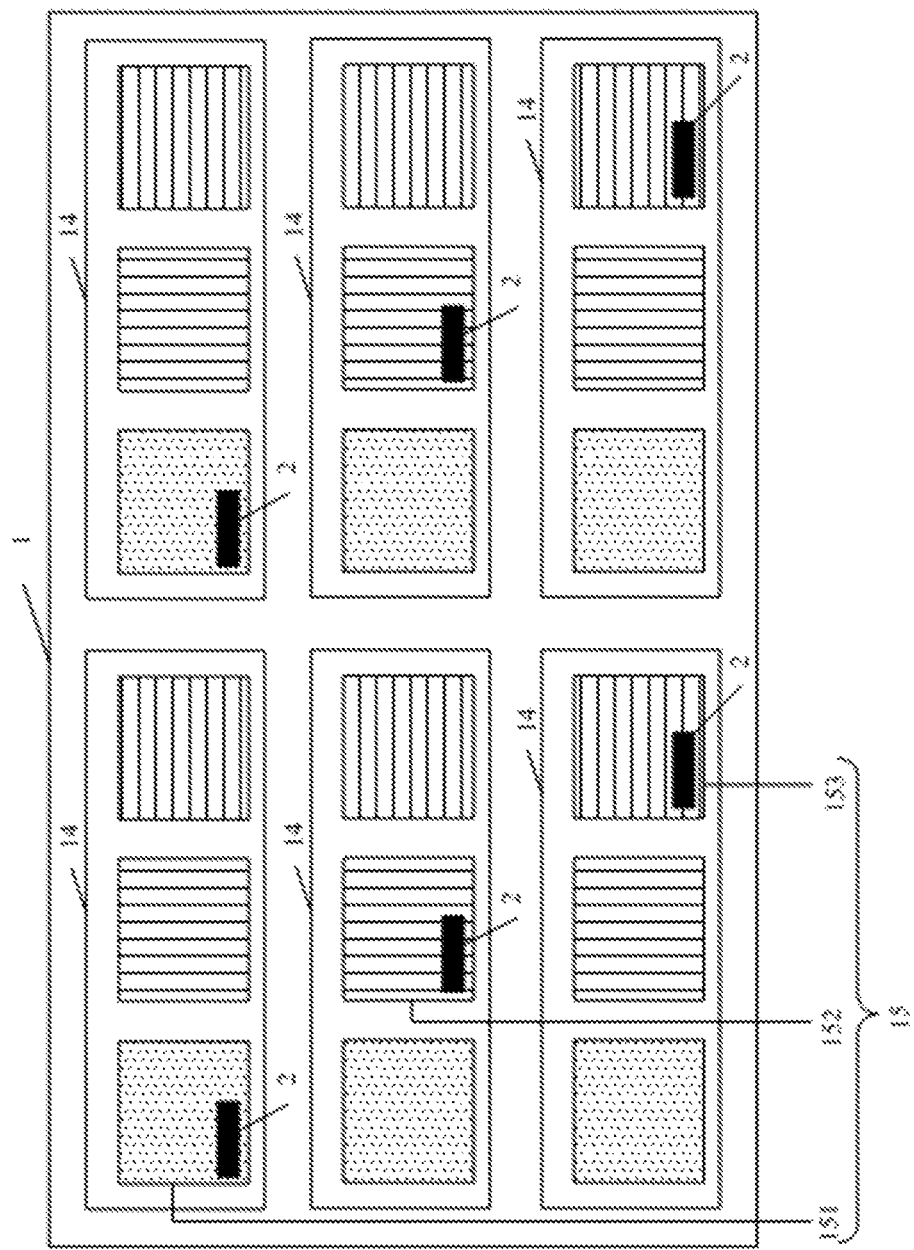
FIG. 8 illustrates a distribution of the photographing pixel unit in the display panel according to a second embodiment of the disclosure.

FIG. 7 and FIG. 8 illustrate two different embodiments of the display panel in terms of different arrangements of the optical sensing portions 21 relative to the pixel subunits in the display panel.

In both FIG. 7 and FIG. 8, which both illustrate a total of 18 pixel subunits over the substrate 1, which are furthermore aligned in a 3×6 matrix. As shown in the figures, every three pixel subunits in a row include a red pixel subunit 141, a green pixel subunit 142, and a blue pixel subunit 143, which together form a pixel unit (termed a display pixel unit 14). As such, among the 18 pixel subunits, there are a total of 6 display pixel units.

In one embodiment of the display illustrated in FIG. 7, each of the three pixel subunits in each display pixel unit 14 correspondingly includes an optical sensing portion 21. As such, each display pixel unit 14 may thus also form a photographing pixel unit 15.

In other words, in each display pixel unit 14, the optical sensing portion 21 in the red pixel subunit 141, the optical sensing portion 21 in the green pixel subunit 142, and the optical sensing portion 21 in the blue pixel subunit 143 may respectively be a red photographing pixel subunit 151, a green photographing pixel subunit 152, and a blue photographing pixel subunit 153, which together form a photographing pixel unit 15, allowing the display panel to realize the photographing functionality (or the camera functionality) to be able to capture images.

In another embodiment of the display illustrated in FIG. 8, only one of the three pixel subunits in each display pixel unit 14 includes an optical sensing portion 21 corresponding thereto, and among every three adjacent display pixel unit 14 along a column direction, the three pixel subunits having an optical sensing portion 21 therein is configured to correspond to a different color, and together form a photographing pixel unit 15, allowing the display panel to realize the photographing functionality (or the camera functionality) to be able to capture images.

In other words, a pixel subunit having an optical sensing portion 21 that corresponds to a red color in a first row, the pixel subunit having an optical sensing portion 21 that corresponds to a green color in a second row, and the pixel subunit having an optical sensing portion 21 that corresponds to a blue color in a third row together form a photographing pixel unit 15, and these above three pixel subunits are respectively a red photographing pixel subunit 151, a green photographing pixel subunit 152, and a blue photographing pixel subunit 153.

Compared with the embodiment of the display panel as illustrated in FIG. 7, the embodiment of the display panel has a reduced number of the optical sensing portions 21, which in turn can lead to a reduced manufacturing cost and a reduced occupation of inner space by the optical sensing portion 21 in the display panel.

It is noted that the arrangement and distribution of the photographing pixel units 15 in the display panel is not limited to the embodiments as described above and illustrated in FIG. 7 and FIG. 8. Other arrangements and distributions of the photographing pixel units 15 are also possible, as long as the various pixel subunits in each of the photographing pixel units 15 allow mixing of different colored optical signal to thereby re-build a colored image of the object to be photographed.

In a second aspect, the present disclosure further provides a method for manufacturing the display panel as described above.

Figure 9:
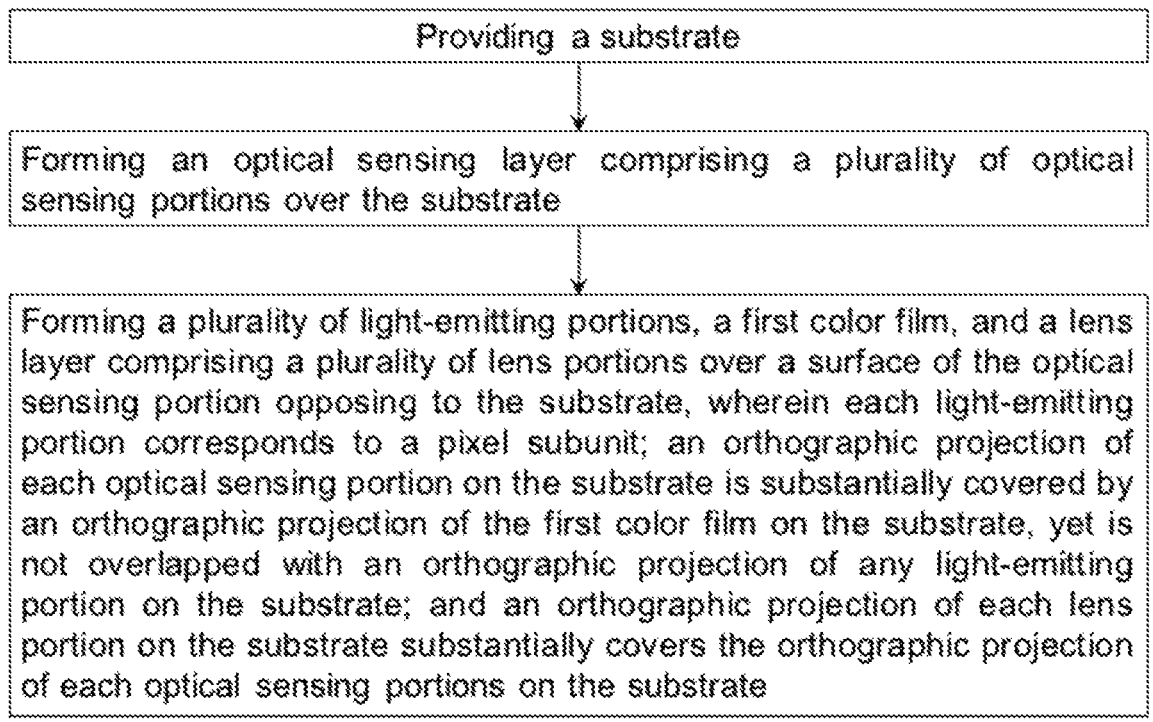
FIG. 9 is a flow chart of a method for manufacturing a display panel according to a first embodiment of the disclosure.

With reference to FIG. 1 and FIG. 9, the manufacturing method includes the following steps:

providing a substrate 1;

forming an optical sensing layer comprising a plurality of optical sensing portions 21 over the substrate 1; and forming a plurality of light-emitting portions, a first color film, and a lens layer comprising a plurality of lens portions 22 over a surface of the optical sensing portion 21 opposing to the substrate 1, wherein each light-emitting portion corresponds to a pixel subunit; an orthographic projection of each optical sensing portion on the substrate is substantially covered by an orthographic projection of the first color film on the substrate, yet is not overlapped with an orthographic projection of any light-emitting portion on the substrate; and an orthographic projection of each lens portion on the substrate substantially covers the orthographic projection of each optical sensing portions on the substrate.

Herein each light-emitting portion typically includes a first electrode layer 3 as described above, a second electrode layer 5, and a light-emitting layer sandwiched in between. The first electrode layer 3 is arranged to be closer to, whereas the second electrode layer 5 is arranged to be farther away from, the substrate 1. The light-emitting layer may be an OLED light-emitting layer.

Figure 10:
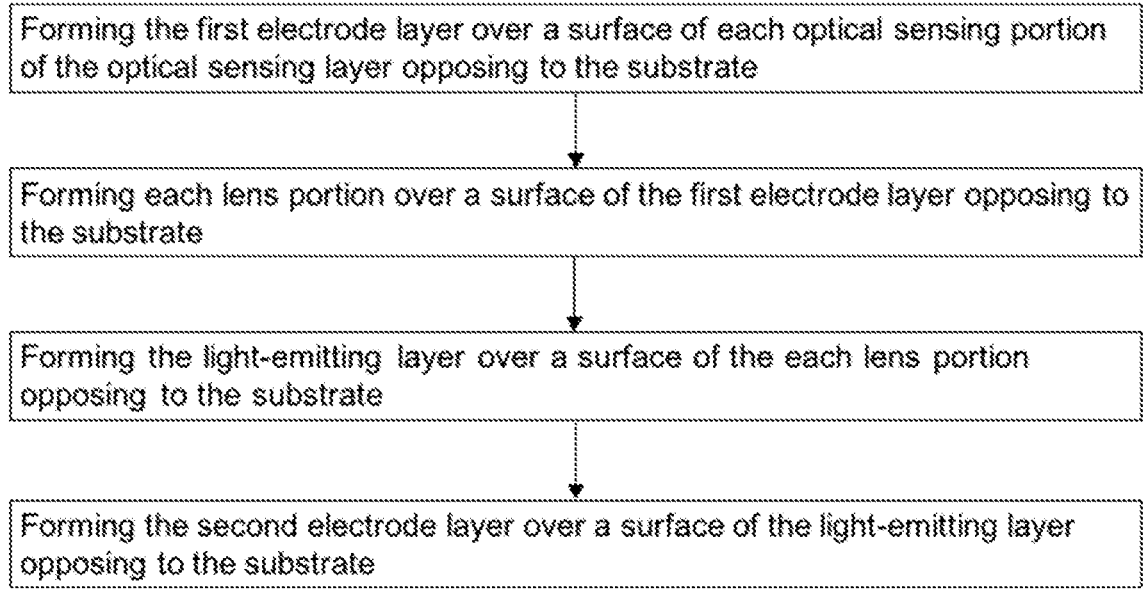
FIG. 10 is a flow chart of a method for manufacturing a display panel according to a second embodiment of the disclosure.

With reference to FIG. 10, the step of forming a plurality of light-emitting portions, a first color film, and a lens layer comprising a plurality of lens portions 22 over a surface of the optical sensing portion 21 opposing to the substrate 1 in the manufacturing method comprises the following substeps:

forming the first electrode layer 3 over a surface of each optical sensing portion 21 of the optical sensing layer opposing to the substrate 1;

forming each lens portion 22 over a surface of the first electrode layer 3 opposing to the substrate 1;

forming the light-emitting layer over a surface of the each lens portion 22 opposing to the substrate 1; and forming the second electrode layer 5 over a surface of the light-emitting layer opposing to the substrate 1.

Herein the first electrode layer 3 in the display panel may be divided into a first portion and a second portion. The first portion and the second portion of the first electrode layer 3 are configured to respectively correspond to a display region and a non-display region of a pixel subunit (i.e. an orthographic projection of the first portion of the first electrode layer 3 on the substrate 1 overlaps with an orthographic projection of the display region of the pixel subunit on the substrate 1, and an orthographic projection of the second portion of the first electrode layer 3 on the substrate 1 overlaps with an orthographic projection of the non-display region of the pixel subunit on the substrate 1).

As such, according to some embodiment of the method, the sub-step of forming the lens portion 22 over a surface of the first electrode layer 3 opposing to the substrate 1 comprises:

forming the lens portion 22 over a surface of the second portion of the first electrode layer 3 opposing to the substrate 1, wherein the second portion of the first electrode layer 3 is configured to cover the corresponding optical sensing portion 21 (i.e. an orthographic projection of the second portion of the first electrode layer 3 on the substrate 1 completely covers an orthographic projection of the corresponding optical sensing portion 21 on the substrate 1).

Alternatively, according to some other embodiment of the method, the sub-step of forming the lens portion 22 over a surface of the first electrode layer 3 opposing to the substrate 1 comprises:

forming the lens portion 22 over a surface of the first portion and the second portion of the first electrode layer 3 opposing to the substrate 1, wherein the second portion of the first electrode layer 3 is configured to cover the corresponding optical sensing portion 21 (i.e. an orthographic projection of the second portion of the first electrode layer 3 on the substrate 1 completely covers an orthographic projection of the corresponding optical sensing portion 21 on the substrate 1).

By configuring the lens portion 22 over a surface of the second portion of the first electrode layer 3 opposing to the substrate 1 (i.e. by configuring the lens portion 22 substantially in the non-display region of the pixel subunit), the lens portion 22 and the corresponding optical sensing portion 21 together can form an optical sensing assembly 2, which can effectively capture optical signal from an object to be photographed.

By configuring the lens portion 22 over a surface of the first portion of the first electrode layer 3 opposing to the substrate 1 (i.e. by configuring the lens portion 22 substantially in the display region of the pixel subunit), the lens portion 22 can reduce the loss of lights emitting from the light-emitting layer when the display panel is on the display mode, in turn resulting in an increased light extraction rate of the light-emitting portion.

According to some embodiments of the method, the sub-step of forming the first electrode layer 3 over a surface of the optical sensing portion 21 opposing to the substrate 1 can include:

forming a first color film 7 over the surface of the optical sensing portion 21 opposing to the substrate 1; and forming the first electrode layer 3 over a surface of the first color film 7 opposing to the substrate 1.

Figure 11:
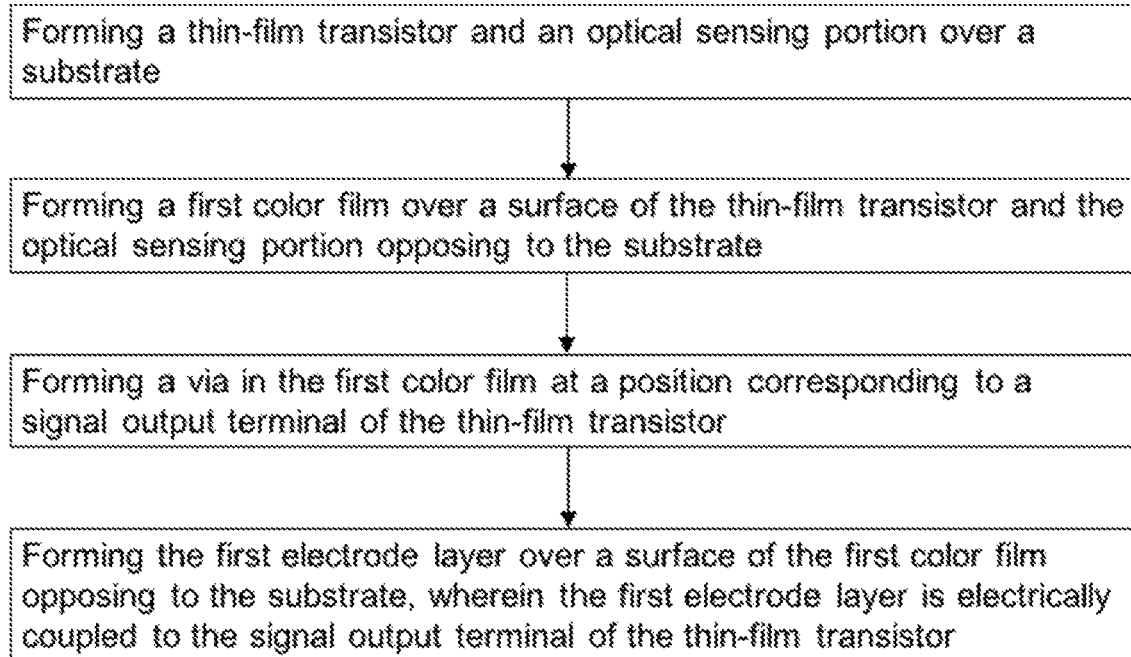
FIG. 11 is a flow chart of a method for manufacturing a display panel according to a third embodiment of the disclosure.

In embodiments of the display panel where each pixel subunit includes a thin-film transistor 6, as illustrated in FIG. 11, prior to the forming a first color film 7 over the surface of the optical sensing portion 21 opposing to the substrate 1, the method further comprises:

forming a thin-film transistor 6 over the substrate 1.

Accordingly, in the forming a first color film 7 over the surface of the optical sensing portion 21 opposing to the substrate 1, the first color film 7 is configured to cover the thin-film transistor 6.

Further accordingly, the forming the first electrode layer 3 over a surface of the first color film 7 opposing to the substrate 1 further includes:

forming a via in the first color film 7 at a position corresponding to a signal output terminal 62 of the thin-film transistor 6; and forming the first electrode layer 3 over a surface of the first color film 7 opposing to the substrate 1, wherein the first electrode layer 3 is configured to be electrically coupled to the signal output terminal 62 of the thin-film transistor 6.

If the light-emitting layer has a composition of a colored light-emitting organic electroluminescent material, in order for the display panel to realize a colored display, when manufacturing the display panel, it can be configured such that in a same pixel subunit, the organic electroluminescent material has a substantially same color as the first color film 7.

If the light-emitting layer has a composition of a white light-emitting organic electroluminescent material, in order for the display panel to realize a colored display, the method for manufacturing the display panel further comprises:

forming a second color film 11 over a surface of a portion of the second electrode layer 5 opposing to the substrate 1, wherein the portion of the second electrode layer 5 corresponds to the display region of each pixel subunit (i. e. an orthographic projection of the portion of the second electrode layer 5 on the substrate 1 falls within an orthographic projection of the display region of each pixel subunit on the substrate 1), and it is configured such that in a same pixel subunit, the second color film 11 has a substantially same color as the first color film 7.

In embodiments of the display panel where the light-emitting layer has a composition of a white light-emitting organic electroluminescent material, the sub-step of forming the first electrode layer 3 over a surface of the optical sensing portion 21 opposing to the substrate 1 can alternatively include, as illustrated in FIG. 12:

forming a planarization layer 12 over the surface of the optical sensing portion 21 opposing to the substrate 1; and forming the first electrode layer 3 over a surface of the planarization layer 12 opposing to the substrate 1.

Accordingly, the method for manufacturing a display panel can further include:

forming a third color film 13 over a surface of the second electrode layer 5 opposing to the substrate 1, wherein an orthographic projection of the third color film 13 on the substrate 1 covers an orthographic projection of the white light-emitting layer and the optical sensing portion 21 on the substrate 1.

In addition, the method for manufacturing a display panel can alternatively include:

forming a third color film 13 over a surface of a encasing substrate 9; and aligning the encasing substrate 9 having the third color film 13 such that the surface of the encasing substrate 9 having the third color film 13 faces the substrate 1; and finishing packaging by means of a glass powder.

In a third aspect, the present disclosure further provides a display apparatus. The display apparatus includes a display panel according to any of the embodiments as described above.

The display apparatus further includes an image capturing control circuit, which is coupled with the one or more optical sensing portions (e.g. optoelectronic diodes) in the display panel. Herein the image capturing control circuit is configured to control an optical sensing portion in each of the optical sensing portion, and to capture the optical signal from an object that is detected by the optical sensing portion, thereby allowing the display panel to realize an image capturing functionality.

Specifically, the image capturing control circuit can include a sub-circuit for driving an image capturing, which is coupled to the optical sensing portion. In order for a simplified structure of the display panel, the image capturing control circuit can be integrated with other types of drive circuits in a same driving chip or in a same printed circuit board (PCB).

Herein the display apparatus can be a product or a component employed in a cellular phone, a tablet computer, a laptop computer, a monitor, a television, a digital camera, or a GPS device, allowing these products/components to have a dual functionalities including display and camera.

Although specific embodiments have been described above in detail, the description is merely for purposes of illustration. It should be appreciated, therefore, that many aspects described above are not intended as required or essential elements unless explicitly stated otherwise.

Various modifications of, and equivalent acts corresponding to, the disclosed aspects of the exemplary embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

The invention claimed is:

1. A display panel capable of displaying images on, and photographing an object facing, a display surface thereof, the display panel comprising:
   a substrate;
   a plurality of pixel units over the substrate, each comprising at least one pixel subunit;
   a first color film over the substrate; and
   an optical sensing layer, sandwiched between the first color film and the substrate, and configured to detect optical signals from, and based thereon to allow the display panel to photograph, the object;
   wherein:
      each of the at least one pixel subunit in each of the plurality of pixel units comprises a light-emitting portion;
      the optical sensing layer comprises a plurality of optical sensing portions, each arranged such that an orthographic projection thereof on the substrate is substantially covered by an orthographic projection of the first color film on the substrate, yet is not overlapped with an orthographic projection of the light-emitting portion of the each of the at least one pixel subunit on the substrate;
      the light-emitting portion of the each of the at least one pixel subunit in the each of the plurality of pixel units comprises:

a first electrode layer over the substrate;
a second electrode layer over the first electrode layer; and
an organic light-emitting layer between the first electrode layer and the second electrode layer;
the display panel further comprising a lens layer over the optical sensing layer configured to allow for effective focusing of the optical signals onto the optical sensing layer, wherein the lens layer is disposed on a surface of the first electrode layer distal to the substrate.

2. The display panel of claim 1, further comprising a lens layer over the optical sensing layer configured to allow for effective focusing of the optical signals onto the optical sensing layer, wherein:
the lens layer is arranged such that an orthographic projection thereof on the substrate substantially covers the orthographic projection of each of the plurality of optical sensing portions on the substrate.

3. The display panel of claim 2, wherein the lens layer is further arranged such that the orthographic projection thereof on the substrate is overlapped with the orthographic projection of the light-emitting portion of the each of the at least one pixel subunit on the substrate.

4. The display panel of claim 2, wherein the lens layer comprises a plurality of protrusions, wherein:
a surface of each of the plurality of protrusions opposing to the substrate is at least one of a convex shape or a prismatic shape.

5. The display panel of claim 1, wherein the each of the at least one pixel subunit comprises a thin-film transistor configured to drive the light-emitting portion to emit a light, wherein the thin-film transistor comprises an electrode electrically coupled to the first electrode layer.

6. The display panel of claim 5, wherein the each of the at least one pixel subunit further comprises an insulating layer between the light-emitting portion and the thin-film transistor, wherein the first electrode layer is electrically coupled to the electrode of the thin-film transistor through a via in the insulating layer.

7. The display panel of claim 1, wherein the first color film comprises a plurality of first color filter portions, arranged such that an orthographic projection of each of the plurality of first color filter portions on the substrate substantially covers an orthographic projection of one of the plurality of optical sensing portions on the substrate.

8. The display panel of claim 7, wherein the plurality of first color filter portions comprises a red first color filter portion, a green first color filter portion and a blue first color filter portion.

9. The display panel of claim 1, wherein:
each of the at least one pixel subunit in each of the plurality of pixel units comprises a white light-emitting portion configured to emit a white light; and
the display panel further comprises a second color film over the white light-emitting portion in the each of the at least one pixel subunit in each of the plurality of pixel units, wherein:
the second color film comprises a plurality of second color filter portions, arranged such that an orthographic projection of each of the plurality of second color filter portions on the substrate substantially covers an orthographic projection of the white light-emitting portion in each of the at least one pixel subunit in each of the plurality of pixel units.

10. The display panel of claim 9, wherein the orthographic projection of each of the plurality of second color filter portions on the substrate further substantially covers an orthographic projection of one of the plurality of optical sensing portions of the optical sensing layer on the substrate.

11. The display panel of claim 9, wherein the plurality of second color filter portions comprises a red second color filter portion, a green second color filter portion, and a blue second color filter portion.

12. The display panel of claim 1, wherein each of the plurality of optical sensing portions comprises an optoelectronic diode, configured to convert at least one of the optical signals into an electric signal.

13. The display panel of claim 1, wherein:
the plurality of optical sensing portions correspond to some, but not all, of the pixel subunits; and
an orthographic projection of the each of the plurality of optical sensing portions on the substrate is adjacent to an orthographic projection of a corresponding pixel subunit on the substrate.

14. The display panel of claim 13, wherein the plurality of pixel units are arranged in a matrix having rows and columns, wherein each pixel unit in each row comprises at least three pixel subunits, wherein:
the at least three pixel subunits are configured to each provide a light of a different primary color, and to together provide a white light; and
every n adjacent pixel units along a column direction are configured such that only one of the at least three pixel subunits in each of the every n adjacent pixel units is provided with a corresponding optical sensing portion, configured to detect a light of a different primary color to thereby allow a mixing of lights to form a white light by the optical sensing portions corresponding to the every n adjacent pixel units.

15. A display apparatus, comprising a display panel according to claim 1.

16. A display panel capable of displaying images on, and photographing an object facing, a display surface thereof, the display panel comprising:
a substrate;
a plurality of pixel units over the substrate, each comprising at least one pixel subunit;
a first color film over the substrate; and
an optical sensing layer, sandwiched between the first color film and the substrate, and configured to detect optical signals from, and based thereon to allow the display panel to photograph, the object;
wherein:
each of the at least one pixel subunit in each of the plurality of pixel units comprises a light-emitting portion;
the optical sensing layer comprises a plurality of optical sensing portions, each arranged such that an orthographic projection thereof on the substrate is substantially covered by an orthographic projection of the first color film on the substrate, yet is not overlapped with an orthographic projection of the light-emitting portion of the each of the at least one pixel subunit on the substrate;
the at least one pixel subunit in each of the plurality of pixel units comprises:
a red pixel subunit, comprising a red light-emitting portion configured to emit a red light;
a green pixel subunit comprising a green light-emitting portion configured to emit a green light; and
a blue pixel subunit comprising a blue light-emitting portion configured to emit a blue light.

17. A display panel capable of displaying images on, and photographing an object facing, a display surface thereof, the display panel comprising:
- a substrate;
- a plurality of pixel units over the substrate, each comprising at least one pixel subunit;
- a first color film over the substrate; and
- an optical sensing layer, sandwiched between the first color film and the substrate, and configured to detect optical signals from, and based thereon to allow the display panel to photograph, the object;

wherein:
- each of the at least one pixel subunit in each of the plurality of pixel units comprises a light-emitting portion;
- the optical sensing layer comprises a plurality of optical sensing portions, each arranged such that an orthographic projection thereof on the substrate is substantially covered by an orthographic projection of the first color film on the substrate, yet is not overlapped with an orthographic projection of the light-emitting portion of the each of the at least one pixel subunit on the substrate;
- each of the plurality of optical sensing portions and each pixel subunit correspond to one another in a one-to-one relationship; and
- an orthographic projection of the each of the plurality of optical sensing portions on the substrate is adjacent to an orthographic projection of a corresponding pixel subunit on the substrate.

18. The display panel of claim 17, wherein the plurality of pixel units are arranged in a matrix having rows and columns, wherein each pixel unit in each row comprises at least three pixel subunits, wherein:
- the at least three pixel subunits are configured to each provide a light of a different primary color, and to together provide a white light; and
- a corresponding optical sensing portion of each of the at least three pixel subunits is configured to detect a light of a different primary color to thereby allow a mixing of lights to form a white light by the optical sensing portions corresponding to the at least three pixel subunits.

* * * * *